United States Patent [19]
Sato et al.

[11] Patent Number: 5,770,495
[45] Date of Patent: Jun. 23, 1998

[54] METHOD OF FABRICATING SEMICONDUCTOR DEVICE INCLUDING HIGH TEMPERATURE HEAT TREATMENT

[75] Inventors: Nolifumi Sato; Shinji Ohara; Hitoshi Mitani; Hidetaka Natsume; Takami Hiruma, all of Tokyo, Japan

[73] Assignee: NEC Corporation, Tokyo, Japan

[21] Appl. No.: 548,913

[22] Filed: Oct. 26, 1995

[30] Foreign Application Priority Data

Oct. 28, 1994 [JP] Japan .................................. 6-265872

[51] Int. Cl.⁶ .................. H01L 21/283; H01L 21/8244
[52] U.S. Cl. ..................... 438/238; 438/384; 438/647; 438/655; 438/770
[58] Field of Search ................................ 438/165, 210, 438/238, 431, 432, 647, 649, 655, 657, 384, 152, 770

[56] References Cited

U.S. PATENT DOCUMENTS

| | | | |
|---|---|---|---|
| 4,392,150 | 7/1983 | Courrages | 438/647 |
| 4,569,122 | 2/1986 | Chan | 438/647 |
| 4,965,214 | 10/1990 | Choi et al. | 438/238 |
| 5,462,894 | 10/1995 | Spinner et al. | 438/647 |

*Primary Examiner*—T. N. Quach
*Attorney, Agent, or Firm*—Sughrue, Mion, Zinn, Macpeak & Seas, PLLC

[57] ABSTRACT

The invention provides a method of fabricating a semiconductor device, including the steps of (a) forming an impurity region at a surface of a silicon substrate, (b) depositing an insulative film over the silicon substrate, (c) forming a contact hole through the insulative film to expose the impurity region of the silicon substrate, (d) forming an electrode wiring over the contact hole, the electrode wiring comprising a refractory metal silicide film and a silicon film overlying on the metal silicide film, the metal silicide film overlying the exposed impurity region, (e) depositing a second insulative film over a resultant, (f) depositing a polysilicon film on the second insulative film, (g) patterning the polysilicon film to form an element, and (h) heat-treating a resultant at high temperature in oxidizing atmosphere. The step (h) is to be carried out at any time after the step (f) has been completed. In the method, even if a semiconductor device is heat-treated at high temperature in oxidizing atmosphere, there occurs no voids in the silicon substrate below the refractory metal silicide film. This is because silicon atoms are supplied from the silicon film overlying on the refractory metal silicide film to the metal silicide film. Thus, reliable electrical connection between the electrode wiring and the silicon substrate is ensured.

20 Claims, 5 Drawing Sheets

METHOD OF FABRICATING SEMICONDUCTOR DEVICE INCLUDING HIGH TEMPERATURE HEAT TREATMENT

BACKGROUND OF THE INVENTION

1. Field of the Invention

The invention relates to a method of fabricating a semiconductor device, and more particularly to a method of fabricating a semiconductor device having a refractory metal silicide film making connection with a region of a semiconductor substrate, and also having an element, such as a resistor, composed of a polysilicon film and formed on the semiconductor substrate.

2. Description of the Related Art

Figure 1A:
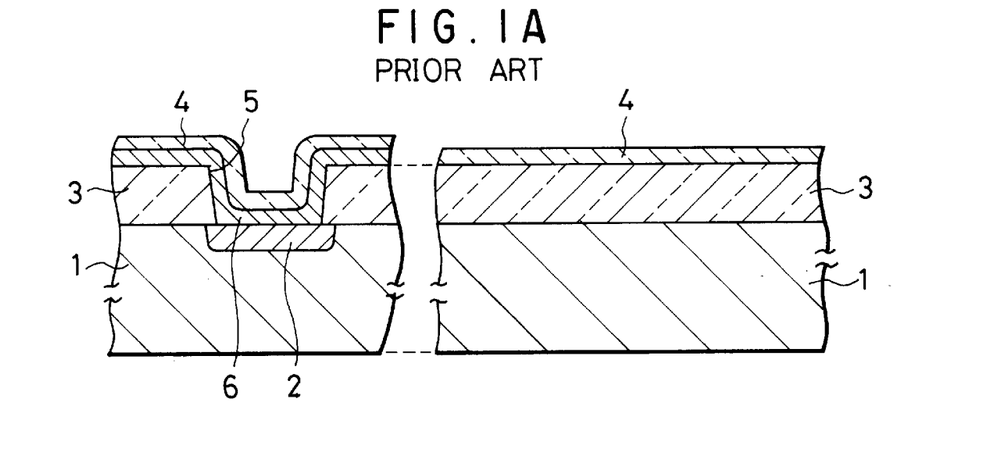
FIGS. 1A, 1B and 1C are cross-sectional views illustrating respective step in a prior method of fabricating a semiconductor device.
Figure 1B:
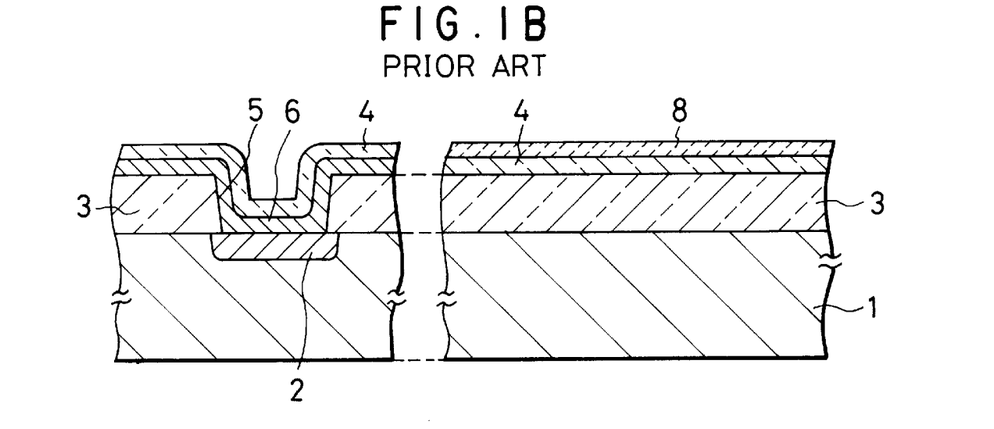
Figure 1C:
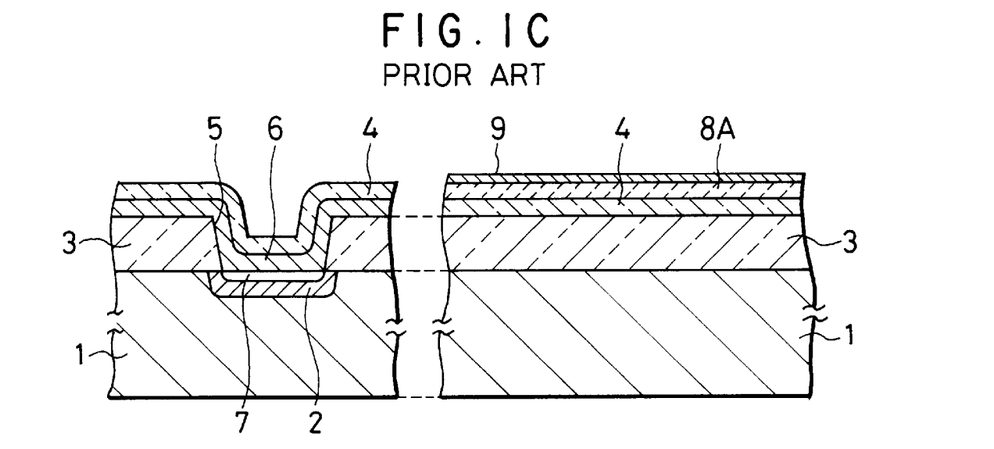

With reference to FIGS. 1A to 1C, hereinbelow is explained a prior method of fabricating a semiconductor device. As illustrated in FIG. 1A, a N-type impurity region 2 (only one is illustrated for clarity) is diffused in a P-type silicon substrate 1, and then an insulative film 3 comprising a field silicon dioxide film and an interlayer insulative film is formed over a main surface of the silicon substrate 1. Then, a contact hole 5 is formed through the insulative layer 3 to expose the N-type impurity region 2, and subsequently there is formed an electrode wiring 6 making contact with the exposed surface of the N-type impurity region 2 and extending over the insulative film 3. The electrode wiring 6 is composed of a refractory metal silicide film. Then, a resultant is covered with an interlayer insulative film 4 composed of silicon dioxide.

Then, as illustrated in FIG. 1B, a polysilicon film is deposited over the interlayer insulative film 4 and is patterned to thereby form a resistive element 8 composed of portions of the polysilicon film having high layer resistance.

As an alternative, there may be sandwiched laminated structure of a gate electrode and a gate insulative film between the interlayer insulative film 4 and the polysilicon film 8, thereby forming a thin film transistor (TFT) including a channel region composed of a portion of the polysilicon film 8 disposed on the gate insulative film, and also including source and drain regions composed of portions of the polysilicon film 8 disposed at opposite sides of the channel region.

The reason why the refractory silicide film is used as an electrode wiring is that if low melting point metal such as aluminum is to be used, it becomes impossible to carry out heat-treatment of a device at high temperature after the electrode wiring has been formed.

In general, as a refractory metal silicide film is used a tungsten silicide (WSi) film, a molybdenum silicide (MoSi) film, or a titanium silicide (TiSi) film. A ratio of the number of atoms constituting those films is as follows.

W:Si=1:2–3

Mo:Si=1:2–3

Ti:Si=1:2–3

Namely, any of those metal silicide films basically has stoichiometric structure having 1 part of W, Mo or Ti against 2 parts of Si. However, material of which wirings of a semiconductor LSI is made becomes more stable by slightly supersaturating the material with Si relative to stoichiometric structure. Thus, a part of Si is set to be more than 2, specifically in the range of 2 to 3, as shown in the above mentioned ratios.

In the case of a resistive element, if a semiconductor wafer is not processed further from the state illustrated in FIG. 1B, layer resistances of the resistive elements 8 formed in several portions of a common semiconductor wafer remain quite different from one another.

In the case of TFT, if a semiconductor wafer is not processed further from the state illustrated in FIG. 1B, an ON/OFF ratio of TFTs formed in several portions of a common semiconductor wafer remains to be small. Herein, the ON/OFF ratio is defined as a ratio of a drain current which would run when TFT is turned on to a drain current (or a leak current) which would run when TFT is turned off.

Attempts to narrow the difference in the layer resistance among the resistive elements and increase the ON/OFF ratio of TFT can be accomplished by heat-treating a semiconductor wafer at high temperature in oxidizing atmosphere.

FIG. 1C illustrates the state of a semiconductor wafer after it has been heat-treated at high temperature for stabilizing a resistive element. As illustrated, the resistive element 8 made of the polysilicon film turns into a resistive element 8A having smaller difference in the layer resistance among the resistive elements. In addition, the heat-treatment thermally oxidizes a surface of the resistive element 8 to thereby form a thin silicon dioxide film 9.

The heat-treatment of TFT at high temperature enhances an ON/OFF ratio, and also thermally oxidizes a surface of channel region, source and drain regions to thereby form a thin silicon dioxide film 9.

However, the above mentioned heat treatment at high temperature also produces a void 7 between the metal silicide film 6 of the electrode wiring and the N-type impurity region 2, and thus there occurs imperfect contact between them. For instance, provided that the contact hole 5 has a cross-section of 700 nm×700 nm square and the tungsten silicide film 6 disposed on the N-type impurity region 2 has a thickness of 80 nm, there would occur the void 7 having a depth of 50 nm.

Thus, in a static random access memory (SRAM) device having a resistive element or TFT as a load, there is produced bits or SRAM cells which do not operate at all. For instance, in the case of 4 megabit SRAM, about one-tenth to one-half of the total number of chips or SRAM devices in a semiconductor wafer become defective, even if a redundancy circuit compensates for such defectiveness.

The inventors have discovered the reason why such a void 7 is produced by the heat-treatment of a semiconductor wafer. The reason is that silicon atoms present in the silicon substrate 1 are attracted to the metal silicide film 6 of the electrode wiring in the heat-treatment of resistive elements or TFT. The later mentioned present invention is based on this discovery.

If the electrode wiring is reconstructed so that the greater number of silicon atoms are brought into contact with the impurity region 2, supersaturated silicon atoms are locally precipitated in a semiconductor wafer process, and thereby form a nodule which would prevent the formation of the electrode wiring. On the other hand, if a silicon film is formed below the refractory metal silicide film to prevent the void, silicon comes to direct contact with the impurity region 2 within the contact hole 5 with the result that the contact resistance is made larger.

SUMMARY OF THE INVENTION

Thus, it is an object of the present invention to provide a method of fabricating a semiconductor device having a refractory metal silicide film making contact with a region of a semiconductor substrate, and also having elements formed on the substrate, such as resistive elements and TFTs made of a polysilicon film, which method does not form any nodule which would be an obstruction for the formation of the electrode wiring, does not increase the contact resistance between the impurity region and the electrode wiring, and further does not produce a void at an interface within a contact hole in heat-treatment of an element such as a resistor or TFT made of poly silicon film, to thereby prevent imperfect contact of the metal silicide film with the impurity region.

The invention provides a method of fabricating a semiconductor device, including the steps of (a) forming an electrode wiring making contact with an impurity region formed at a surface of a silicon substrate, the electrode wiring comprising a refractory metal silicide film and a silicon film overlying on the metal silicide film, the metal silicide film overlying on the impurity region, (b) forming an element of polysilicon in a region other than a region in which the metal silicide film and the silicon film are formed, and (c) heat-treating a resultant at high temperature in oxidizing atmosphere.

The invention further provides a method of fabricating a semiconductor device, including the steps of (a) forming an impurity region at a surface of a silicon substrate, (b) depositing an insulative film over the silicon substrate, (c) forming a contact hole through the insulative film to expose the impurity region of the silicon substrate, (d) forming an electrode wiring over the contact hole, the electrode wiring comprising a refractory metal silicide film and a silicon film overlying on the metal silicide film, the metal silicide film overlying the exposed impurity region, (e) depositing a second insulative film over a resultant, (f) depositing a polysilicon film on the second insulative film, (g) patterning the polysilicon film to form an element such as a resistive element and a thin film transistor (TFT), and (h) heat-treating a resultant at high temperature in oxidizing atmosphere.

In this method, the step (h) is to be carried out at any time after the step (f) has been completed. For instance, the step (h) may be carried out later than the step (f), but prior to the step (g). As an alternative, the step (h) may be carried out later than the step (g). If the method further includes the step of (i) implanting requisite impurities into the deposited polysilicon film, the step (h) may be carried out later than or prior to the step (i).

The invention still further provides a method of fabricating a semiconductor device including a static random access memory having a resistive element, a first field effect transistor having a driver insulative gate, and a second field effect transistor having a transfer insulative gate, a source region of the first field effect transistor being in connection with a source voltage film working as a low level voltage line, an impurity region of the second field effect transistor, which region is to become a source or drain region, being in connection with a bit line or a reverse bit line, the method including the steps of (a) forming an electrode voltage film on the source regions, the electrode voltage film comprising a refractory metal silicide film and a silicon film overlying on the metal silicide film, the refractory metal silicide film and deposited on the source regions, (b) forming an interlayer insulative layer over the silicon film, (c) depositing a polysilicon film over the interlayer insulative layer, (d) patterning the polysilicon film to form the resistive element, and (e) heat-treating a resultant at high temperature in oxidizing atmosphere. The step (e) is to be carried out at any time after the step (c) has been completed.

In the above mentioned method, the heat-treating is carried out preferably at a temperature in the range of 750 degrees to 950 degrees centigrade in dry oxygen atmosphere or wet oxygen/hydrogen atmosphere. In addition, the heat-treating is preferably carried out so that the polysilicon element is oxidized to a depth in the range of 2 nm to 40 nm measured from a surface thereof.

The metal silicide film may be selected from tungsten silicide (WSi) film, molybdenum silicide (MoSi) film and titanium silicide (TiSi) film.

In a preferred embodiment, a ratio of the number of atoms W, Mo or Ti to the number of silicon atoms is preferably 1:2–3.

In another preferred embodiment, the metal silicide film has a thickness in the range of 10 to 50 nm.

In still another preferred embodiment, the silicon film includes silicon atoms therein by at least 80% based on the total number of atoms contained in the silicon film.

In yet another preferred embodiment, the method further includes the step of ion-implanting the same impurities as those contained in the impurity region into the metal suicide film.

In accordance with the above mentioned method, even if a semiconductor wafer is heat-treated at high temperature in oxidizing atmosphere or narrowing a difference in a resistance value of resistive elements and for enhancing an ON/OFF ratio of TFT, silicon atoms are introduced into a refractory metal silicide film from a silicon film overlying on the metal silicide film, and hence it is no longer necessary to introduce silicon atoms into the metal silicide film from a silicon substrate. Hence, a void is no longer produced in the silicon substrate below the metal silicide film. Thus, reliable connection is ensured between the electrode wiring and the silicon substrate, and in addition, it is possible to narrow a difference in a resistance value of resistive elements and enhance an ON/OFF ratio of TFT. Namely, the requisite heat-treating can be carried out for resistive elements and TFT without anxiety about imperfect connection between an electrode wiring and an impurity region of a silicon substrate.

For instance, it is now supposed that a resistive element is composed of a polysilicon film having a thickness of 100 nm, and has a layer resistance ranging from tens of G$\Omega$ per a unit area to a few T$\Omega$ per a unit area in a common semiconductor wafer prior to heat-treatment for stabilizing itself. The resistive element is oxidized in dry oxygen atmosphere or in wet oxygen/hydrogen atmosphere at a temperature to be determined in the range of 750 to 950 degrees centigrade and in a certain period of time in the range of 5 minutes to 1 hour so that the polysilicon film constituting the resistive element is oxidized to a depth in the range of 2 to 40 nm measured from a surface thereof. By this heat-treatment, the layer resistance is made to vary only in the range of A/2 to 2A wherein A indicates a few T$\Omega$ per a unit area as a mean value. Thus, the layer resistance becomes suitable for practical use.

For another instance, it is supposed that TFT has a channel region composed of a polysilicon film having a thickness of 70 nm, and has an ON/ OFF ratio having six figures on a common semiconductor wafer prior to heat-treatment. The TFT is oxidized in dry oxygen atmosphere or in wet oxygen/ hydrogen atmosphere at a temperature to be determined in the range of 750 to 950 degrees centigrade and in a certain period of time in the range of 5 minutes to 1 hour so that the polysilicon film constituting the channel region of TFT is oxidized to a depth in the range of 2 to 40 nm measured from a surface thereof. By this heat-treatment, the ON/OFF ratio can be enhanced to a ratio of seven to eight figures, and hence TFT can be practically used.

It should be noted that even if a semiconductor wafer or TFT is subject to such a heat-treatment at high temperature, there never occurs a space or imperfect contact between the substrate and the electrode wiring comprising a metal silicide film and a silicon film and being in contact with the substrate. Thus, since the refractory metal silicide film having suitable structure as a wiring is deposited on the substrate, and the silicon film is deposited on the metal silicide film, there is produced no nodules which would be an obstruction to the formation of an electrode wiring, and the contact resistance is made smaller.

The present invention may be applied to SRAM. By applying the laminated layer electrode structure in accordance with the invention to a source voltage film connecting to a source region of a driver transistor, or to a connection pad film for connecting the source voltage film and an impurity region of a transfer transistor to a bit line and a reverse bit line, respectively, there is produced no voids between the source region of the driver transistor and the source voltage film serving as a low level voltage line, and further between the bit line, the reverse bit line and the impurity region of a transfer gate, even if a resistive element made of a polysilicon film is heat-treated at high temperature. Hence, there is no longer generated a defective chip or SRAM device caused by a defective bit or SRAM cell.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 2A:
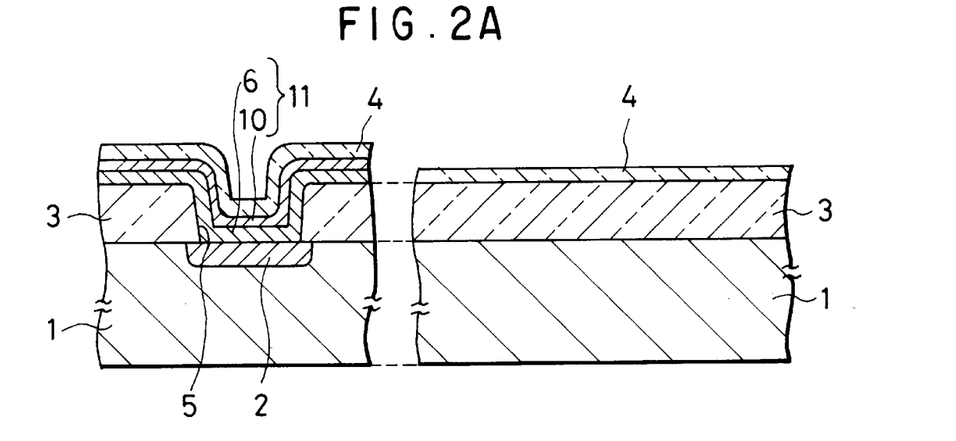
FIGS. 2A, 2B and 2C are cross-sectional views illustrating respective step in a method of fabricating a semiconductor device in accordance with the first embodiment of the present invention.
Figure 2B:
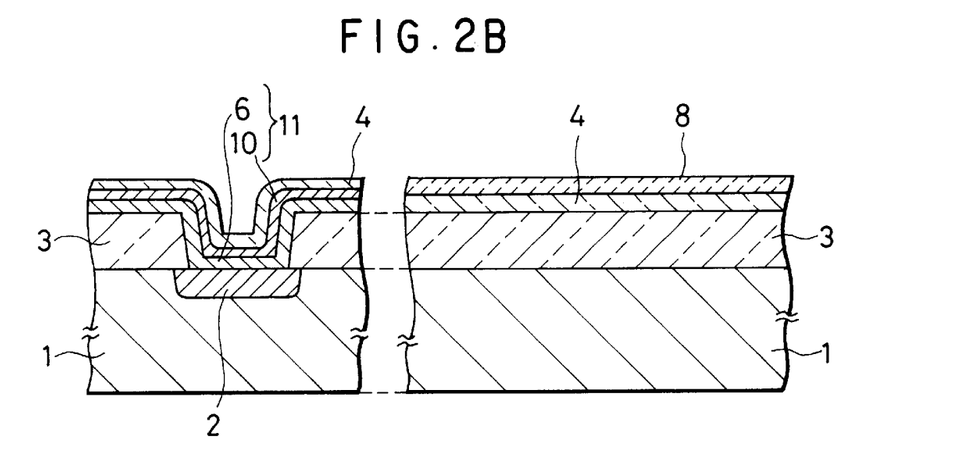
Figure 2C:
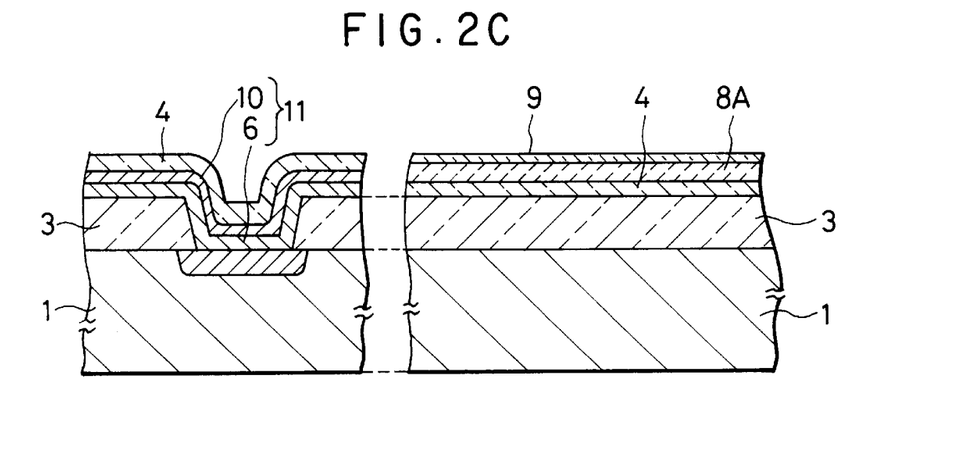

FIGS. 2A to 2C illustrate respective step in a method of fabricating a resistive element of a polysilicon film in accordance with the first embodiment of the present invention.

As illustrated in FIG. 2A, an insulative film 3 is first formed on a main surface of a P-type silicon substrate 1. The insulative film 3 comprises a field silicon dioxide film, and an interlayer insulative film composed of BPSG, overlying on the field silicon dioxide film. Below the main surface of the silicon substrate 1 is also formed an N-type impurity region 2 serving as a source/drain region of a transistor. The N-type impurity region 2 contains phosphorus (P) or arsenic (As) by about $10^{20}/cm^3$, and has a depth in the range of 100 nm to 300 nm.

A contact hole 5 is formed through the interlayer insulative film of the insulative film 3 to expose a contact surface of the N-type impurity region 2. The contact hole 5 has a rectangular cross-section having a side having a length in the range of 300 nm to 1 $\mu$m. For instance, the contact hole 5 has a cross-section of 700 nm×700 nm square.

Then, a refractory metal silicide film 6 and a thickness in the range of 70 nm to 500 nm is deposited all over a resultant by sputtering. The metal silicide film 6 is selected from a tungsten silicide (WSi) film, a molybdenum silicide (MoSi) film or a titanium silicide (TiSi) film. A silicon film 10 having a thickness in the range of 10 nm to 50 nm is further deposited over the metal silicide film 6 by sputtering. N-type impurities may be ion-implanted into the underlying metal silicide film 6 by about $10^{21}/cm^3$, if necessary, in order to stabilize contact resistance in a contact portion at which the metal silicide film 6 comes to contact with the N-type impurity region 2.

The above mentioned tungsten silicide (WSi) film, molybdenum silicide (MoSi) film, or titanium silicide (TiSi) film has a ratio of the number of atoms constituting those films as follows.

W:Si=1:2–3

Mo:Si=1:2–3

Ti:Si=1:2–3

The silicon film 10 deposited by sputtering has polycrystal or amorphous structure, and has silicon atoms by 80% or greater by atoms % or mol %, that is, based on the total number of atoms contained therein. For instance, if the silicon film 10 contains mainly silicon and slightly tungsten, the following equation has to be established.

[(Number of Si)/(Number of Si and W)]×100≧80

Accordingly, the silicon film 10 may be a film made of pure silicon, or may contain silicon atoms by 100%. As an alternative, the silicon film 10 may contain silicon atoms by 90% and tungsten atoms by 10% with respect to the number of atoms. In this case, a ratio of the number of atoms is W:Si=1:9.

Then, the laminated films 10 and 6 are patterned to thereby form an electrode wiring 11 which is in contact with the surface of the N-type impurity region 2 through the contact hole 5 and extend over the insulative film 3. As is obvious from the foregoing, the electrode wiring 11 consists of the underlying refractory metal silicide film 6 and the overlying silicon film 10. Then, the silicon film 10 and the insulative film 3 is entirely covered with an interlayer insulative film 4 composed of silicon dioxide or BPSG.

Then, as illustrated in FIG. 2B, a polysilicon film is deposited over the interlayer insulative film 4 by chemical vapor deposition (CVD), and subsequently patterned to thereby form a resistive element 8. At this stage, the layer resistances of the resistive elements 8 formed in a common semiconductor wafer or semiconductor chip remain quite different with one another. For instance, when the polysilicon film 8 has a thickness of 100 nm, the layer resistance has a mean value of hundreds of GΩ per a unit area, and has a variation in the range of tens of GΩ per a unit area to thousands of GΩ per a unit area.

Then, as illustrated in FIG. 2C, in order to minimize the variation of the layer resistance, a semiconductor wafer or chip is heat-treated at a temperature in the range of 750 to 950 degrees centigrade under normal pressure in oxygen atmosphere (dry oxidizing atmosphere) or hydrogen/oxygen atmosphere (wet oxidizing atmosphere) to thereby oxidize the polysilicon film 8 to a depth in the range of 2 nm to 20 nm measured from a surface thereof. Thus, over the polysilicon film 8 is formed a thin silicon dioxide film 9 having a thickness in the range of 4 nm to 40 nm. At the same time, the resistive element 8 turns into a resistive element 8A in which the variation of the layer resistance is minimized.

After the heat-treatment as above mentioned has been completed, the variation of the layer resistance in the resistive element 8A in a common semiconductor wafer is limited within the range of A/2 to 2A wherein A indicates a mean value of the layer resistance. For instance, the mean value A is few TΩ per a unit area. Thus, the semiconductor wafer is rendered suitable for practical use.

As is obvious from FIG. 2C, even if the heat-treatment as above mentioned is carried out for a semiconductor wafer or chip, there never occurs a void at a surface of the N-type impurity region 2 keeping in contact with the metal silicide film 6. Namely, the silicon film 10 ensures that perfect contact is maintained between the metal silicide film 6 and the N-type impurity region 2.

The embodiment illustrated in FIGS. 2A to 2C shows the method of fabricating a resistive element of the polysilicon film 8. It should be noted that the method can be applied to fabrication of TFT of the polysilicon film 8. When TFT is to be fabricated from the polysilicon film 8, a gate electrode and a gate insulative film are deposited on predetermined portions of the interlayer insulative layer 4 in the step illustrated in FIG. 2B. Then, the polysilicon film 8 is deposited on the gate insulative film and the interlayer insulative film 4. A portion of the polysilicon film 8 on the gate insulative film is processed to be a channel region, and portions at the opposite sides of the channel region are processed to be source and drain regions. Then, in order to enhance an ON/OFF ratio of TFT, TFT is oxidized at a temperature in the range of 750 to 950 degrees centigrade under normal pressure in oxygen atmosphere (dry oxidizing atmosphere) or hydrogen plus oxygen atmosphere (wet oxidizing atmosphere). Thus, TFT is oxidized to a depth in the range of 2 nm to 20 nm measured from a surface thereof, namely, a surface in the opposite direction to the gate insulative film of the channel region and a surface of source/drain in connection with the firstly mentioned surface. Thus, over the surface of TFT is formed a thin silicon dioxide film having a thickness in the range of 4 nm to 40 nm, and hence the ON/OFF ratio of TFT is enhanced.

The thus heat-treated TFT has an ON/OFF ratio having seven to eight figures.

With reference to FIGS. 3 and 4A to 4E, hereinbelow will be explained an embodiment in which the present invention is applied to SRAM device.

Figure 3:
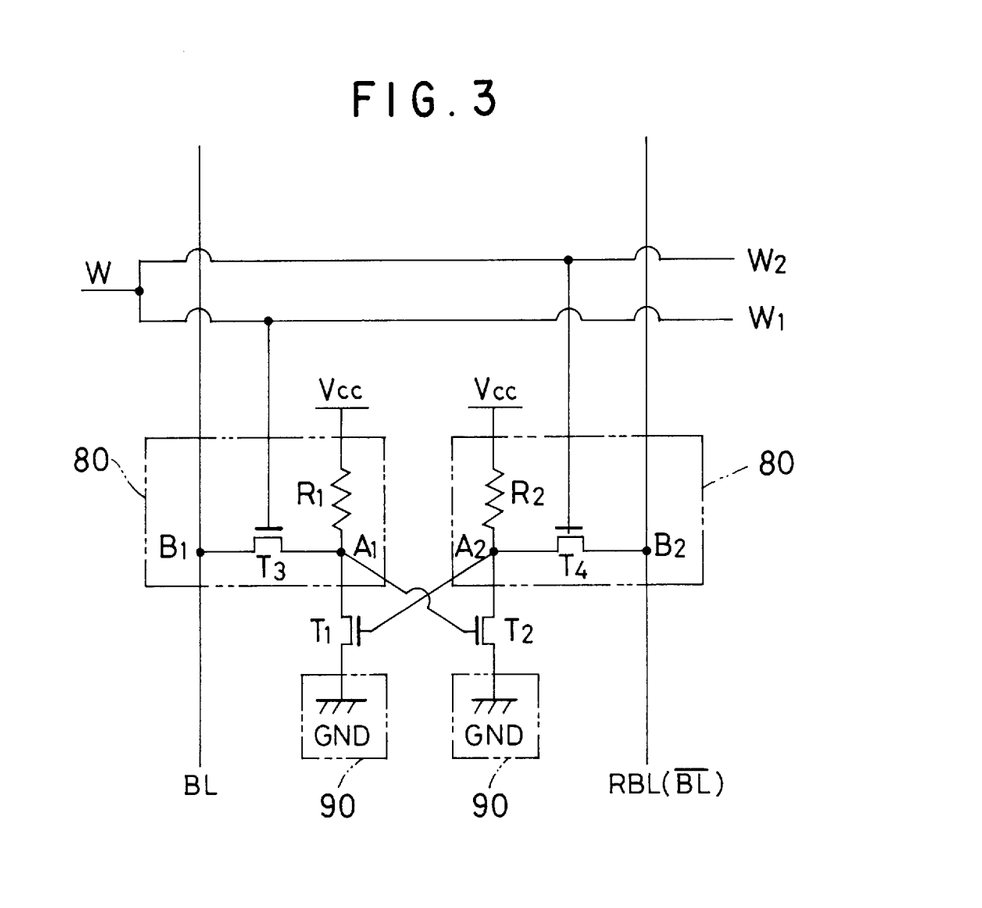
FIG. 3 is a circuit diagram of SRAM cell.

FIG. 3 is a circuit diagram of SRAM cell. A plurality of such SRAM cells are arranged in memory region of SRAM device. Between a Vcc line having a positive level and thereby serving as a high level voltage line and a GND line having a grounded or zero level and thereby serving as a low level voltage line are connected in series a first resistor $R_1$ as a first resistive element and a first driver transistor $T_1$. Similarly, between a Vcc line and a GND line are connected in series a second resistor $R_2$ as a second resistive element and a second driver transistor $T_2$. An end of the first resistor $R_1$, a drain region of the first driver transistor $T_1$ and a gate electrode of the second driver transistor $T_2$ are all connected to a first joint $A_1$, while an end of the second resistor $R_2$, a drain region of the second driver transistor $T_2$ and a gate electrode of the first driver transistor T1 are all connected to a second joint $A_2$, thereby constituting a flip-flop circuit.

When TFT is to be used as a resistive element, first and second TFTs are substituted for the first and second resistors $R_1$ and $R_2$.

One of source and drain regions of a first transfer transistor $T_3$ is connected to a bit line BL at a third joint $B_1$, and the other works also as a drain region of the first driver transistor T1. A gate electrode of the first transfer transistor $T_3$ is connected to a first word line $W_1$. Similarly, one of source and drain regions of a second transfer transistor $T_4$ is connected to a reverse bit line RBL at a fourth joint $B_2$, and the other works also as a drain region of the second driver transistor $T_2$. A gate electrode of the second transfer transistor $T_4$ is connected to a second word line $W_2$. The first and second word lines $W_1$ and $W_2$ are branched out from a word line W outside of the memory region, and thus common signals are transmitted to the first and second word lines $W_1$ and $W_2$.

In FIG. 3, two regions encompassed with a chain line 80 are the same in structure each other, and similarly two regions encompassed with a chain line 90 are the same in structure each other. Thus, each one of the two regions is explained hereinbelow with reference to FIGS. 4A to 4E. In FIGS. 4A to 4E, a part indicated with a reference numeral 80 is a cross-sectional view as seen in a first direction, and a part indicated with a reference numeral 90 is a cross-sectional view as seen in a second direction perpendicular to the first direction. A chain line 100 is an imaginary boundary among SRAM cells arranged in the first direction, while a chain line 200 is an imaginary boundary among SRAM cells arranged in the second direction perpendicular to the first direction.

Figure 4A:
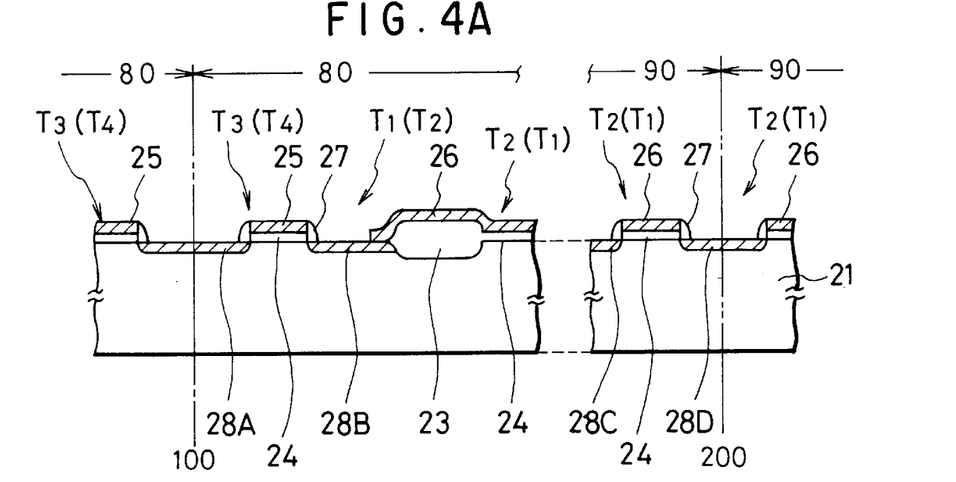
FIGS. 4A, 4B, 4C, 4D and 4E are cross-sectional views illustrating respective step in a method in accordance with the second embodiment in which the present invention is applied to a method of fabricating SRAM.

As illustrated in FIG. 4A, thick field insulative films 23 (only one is illustrated) are formed on a main surface of a P-type silicon substrate 21 by selective oxidation, and then thin gate insulative films 24 are formed in a device region defined by the field insulative films 23.

Then, first and second gate electrodes 25 and 26 highly containing N-type impurities are formed on the gate insulative film 24. Furthermore, side wall insulative film 27 are formed along side walls of the gate insulative films 24 and the gate electrodes 25 and 26. Then, N-type impurities are diffused into the P-type silicon substrate between the gate electrodes 25 and 26 to thereby form N-type impurity regions 28A, 28B, 28C and 28D.

The first N-type impurity region 28A serves as one of source and drain regions of the first transfer transistor $T_3$ (or the second transfer transistor $T_4$), and is electrically connected with the bit line BL (or the reverse bit line RBL). The connection point of the region 28A with the bit line BL is the third joint $B_1$ (or the fourth joint $B_2$).

The second N-type impurity region 28B serves as the other of source and drain regions of the first transfer transistor $T_3$ (or the second transfer transistor $T_4$), and further serves as a drain region of the first driver transistor $T_1$ (or the second driver transistor $T_2$). The second N-type impurity region 28B serves also as the first joint $A_1$ (or the second joint $A_2$).

The third N-type impurity region 28C serves as a drain region of the second driver transistor $T_2$ (or the first driver transistor $T_1$), and further serves as one of source and drain regions of the second transfer transistor $T_4$ (or the third transfer transistor $T_3$). The third N-type impurity region 28C constitutes the second joint $A_2$ ( or the first joint $A_1$).

The fourth N-type impurity region 28D serves as a source region of the second driver transistor $T_2$ (or the first driver transistor $T_1$), and is connected to a grounded level film working as a low level voltage line.

The first gate electrodes 25 are disposed on the gate insulative film 24 of the first word line $W_1$ (or the second word line $W_2$), and serves as a gate electrode of the first transfer transistor $T_3$ (or the second transfer transistor $T_4$).

The second gate electrode 26 serves as a gate electrode of the second driver transistor $T_2$ (or the first driver transistor $T_1$), and extends bridging over the gate insulative film 24, the field insulative film 23 and the drain region 28B of the first driver transistor $T_1$ (or the second driver transistor $T_2$). The second gate electrode 26 constitutes the first joint $A_1$ (or the second joint $A_2$).

Figure 4B:
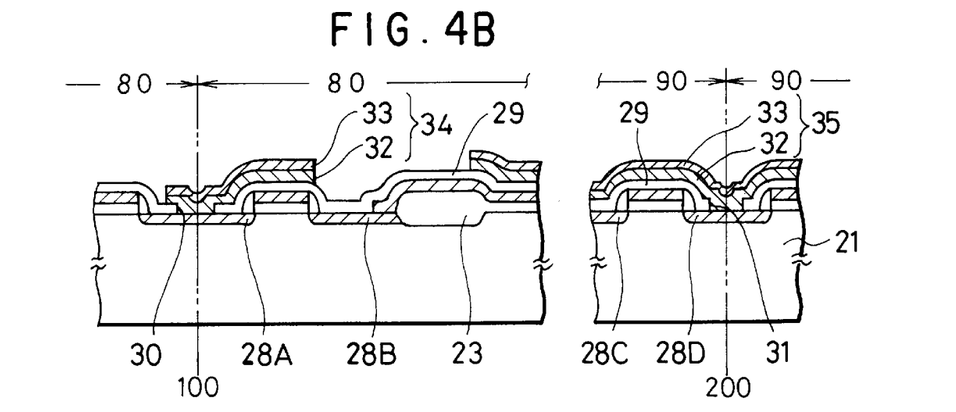

Then, as illustrated in FIG. 4B, a resultant is entirely covered with a first interlayer insulative film 29 composed of silicon dioxide, and subsequently there are formed contact holes 30 and 31 reaching the first and fourth N-type impurity regions 28A and 28B, respectively.

Then, a refractory metal silicide film 32, such as a molybdenum silicide (MoSi) film, is deposited over a resultant by sputtering by a thickness in the range of 70 nm to 500 nm. Then, a silicon film 33 is deposited over the silicide film 32 by sputtering by a thickness in the range of 10 nm to 50 nm.

Then, the deposited films 32 and 33 are patterned to thereby form a connection pad film 34 which is in contact at one end thereof with the first N-type impurity region 28A through the contact hole 30, and at the other end with the bit line BL (or the reverse bit line RBL), and also form a grounded level film 35 which is in contact with the fourth N-type impurity region 28D through the contact hole 31 and extends over the first interlayer insulative film 29. As is obvious, both the connection pad film 34 and the grounded level film 35 consist of the underlying silicide film 32 and the overlying silicon film 33.

Figure 4C:
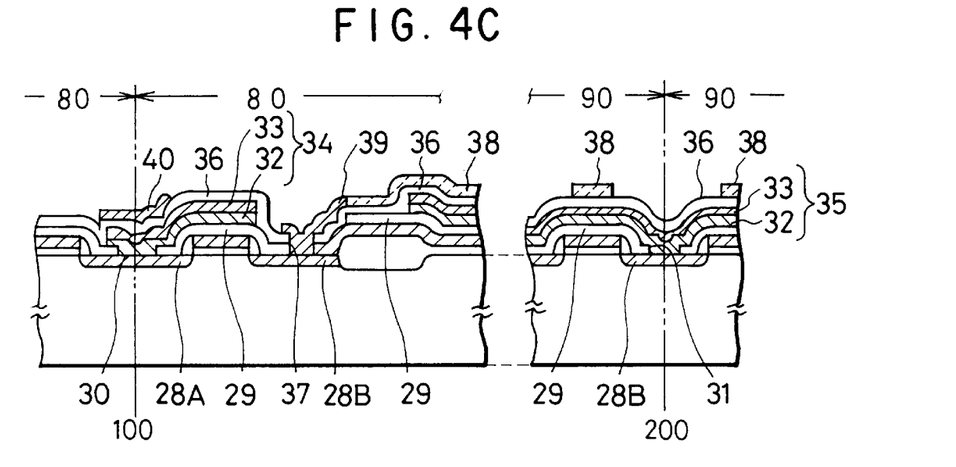

Then, as illustrated in FIG. 4C, a resultant is entirely covered with a second interlayer insulative film 36 composed of silicon dioxide, and subsequently there are formed a contact hole 37 reaching the second N-type impurity region 28B through the second and first interlayer insulative films 36 and 29.

Then, a polysilicon film having a thickness of 100 nm is deposited by CVD on the second interlayer insulative film 36 and over the contact hole 37. Subsequently, the thus deposited polysilicon film is patterned. Among the polysilicon pattern, a region which is to be turned into a resistive element $R_1$ (or $R_2$) 38 is covered with a mask, and then N-type impurities are ion-implanted into other regions. Thus, there is formed a connection 39 which connects the resistive element 38 to the second N-type impurity region 28B and constitutes the first joint A1 (or the second joint A2). In addition, a Vcc line 40 serving as a high level voltage line is formed on the second interlayer insulative film 36.

When TFT is to be used as a load, laminated structure consisting of a gate electrode and a gate insulative film is formed on predetermined portions of the second interlayer insulative film 36, and then a polysilicon film is deposited over the laminated structure as well as the second interlayer insulative film 36. In addition, P-type impurities are ion-implanted to portions disposed at opposite sides of a portion of the polysilicon film which will work as a channel region, thereby source and drain regions of TFT being formed.

Figure 4D:
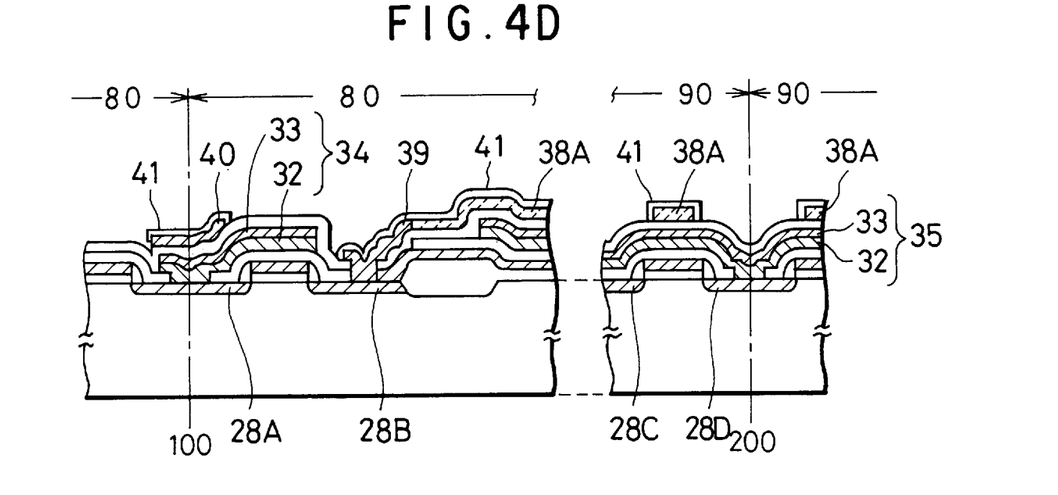

Then, as illustrated in FIG. 4D, a resultant is oxidized at a temperature in the range of 750 to 950 degrees centigrade under normal pressure in oxidizing atmosphere. Thus, the polysilicon film is oxidized to a depth in the range of 2 nm to 20 nm measured from a surface thereof. In addition, a thin silicon dioxide film 41 having a thickness in the range of 4 nm to 40 nm is formed by the heat-treatment as above mentioned on the surface of the polysilicon film or the resistive element 38.

After the heat-treatment as above mentioned has been completed, the variation of the layer resistance in the resistive element 83A composed of the polysilicon film is limited within the range of A/2 to 2A wherein A indicates a mean value of the layer resistance. For instance, the mean value A is a few TΩ per a unit area. Thus, the SRAM device is rendered suitable for practical use.

Similarly, in the case of TFT as a load composed of a polysilicon film, the TFT has an ON/OFF ratio having seven to eight figures. Thus, the TFT is rendered suitable for practical use.

As is obvious from FIG. 4D, even if the heat-treatment as above mentioned is carried out for SRAM device, there never occurs a void at surfaces of the first and fourth N-type impurity regions 28A and 28D keeping in contact with the metal silicide films 82 of the connection pad film 34 and the grounded level film 35, respectively. Namely, the silicon film 33 ensures that perfect contact is maintained between the metal silicide films 32 and the N-type impurity regions 28A and 28D. Thus, there is no longer generated defective chips caused by the heat-treatment of resistive elements at a high temperature.

In the embodiment, the heat-treatment of the resistive element or TFT is carried out later than the patterning of the polysilicon film and introduction of impurities into regions other than regions on which the polysilicon film is patterned. It should be noted that the heat-treatment may be carried out after the deposition of the polysilicon film, but prior to the patterning of the polysilicon film. In this case, the thin silicon dioxide film 41 is concurrently patterned. As an alternative, the heat-treatment may be carried out after the patterning of the polysilicon film, but prior to the introduction of impurities to the above mentioned regions. Since the ion-implanted impurities can pass the thin silicon dioxide film 41 through, there arise no problems in the formation of the connection 39, the Vcc line 40, and source and drain regions of TFT, even if the order of the steps is changed.

Figure 4E:
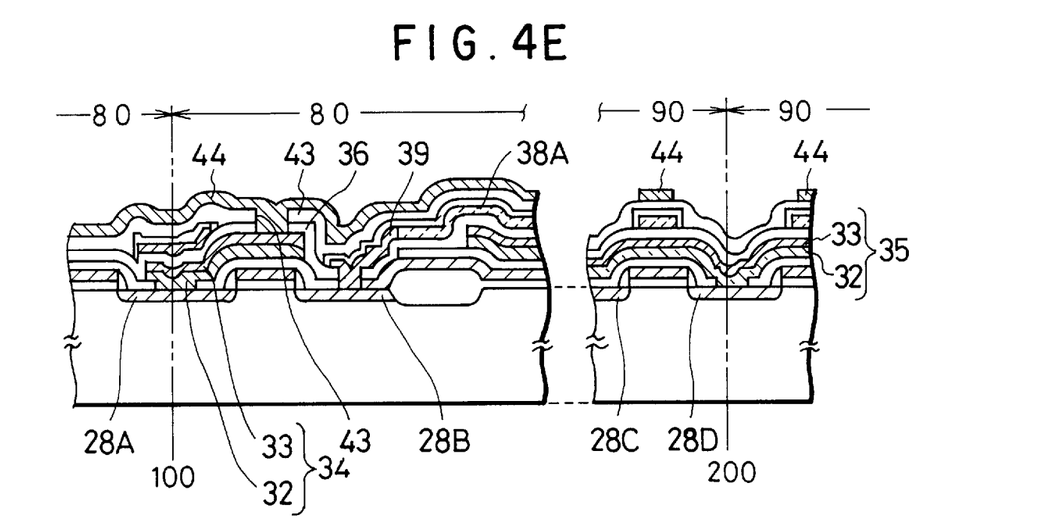

Then, as illustrated in FIG. 4E, a third interlayer insulative film 42 composed of silicon dioxide is deposited over a resultant, and subsequently, there is formed a contact hole 43 through the third and second interlayer insulative films 42 and 43, which contact hole 43 reaches an end of the connection pad film 34. Then, there is formed a bit line BL (or a reverse bit line RBL) composed of an aluminum film 44 which is in contact with the connection pad film 34 through the contact hole 43, and thereby in electrical contact with the first N-type impurity region 28A through the connection pad film 34.

In the embodiment where the present invention is applied to SRAM device, the method in accordance with the invention is to be reduced to practice for the formation of the grounded level film (source voltage film) and the connection pad film. However, in SRAM in which a bit line or a reverse bit line is brought into contact with the impurity region by forming a contact hole through the third, second and first interlayer insulative films 42, 36 and 29 in the step illustrated in FIG. 4E to be carried out after the heat-treatment of a resistive element or TFT is completed, the method in accordance with the invention is used only for the formation of the grounded level film (source voltage film).

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device, comprising the steps of:
   (a) forming an electrode wiring making contact with an impurity region formed at a surface of a silicon substrate, said electrode wiring comprising a refractory metal silicide film and a silicon film overlying said refractory metal silicide film, said refractory metal silicide film overlying said impurity region;
   (b) forming an element of polysilicon in a region other than a region in which said refractory metal silicide film and said silicon film are formed; and
   (c) heat-treating a resultant product of step (b) at high temperature in an oxidizing atmosphere.

2. The method as recited in claim 1, wherein step (c) is carried out at a temperature in the range of 750 degrees to 950 degrees centigrade.

3. The method as recited in claim 1, wherein said step (c) is carried out so that said polysilicon element is oxidized to a depth in the range of 2 nm to 40 nm measured from a surface thereof.

4. The method as recited in claim 1, wherein said refractory metal silicide film is composed of one of tungsten silicide film, molybdenum silicide film and titanium silicide film.

5. The method as recited in claim 4, wherein a ratio of the number of metal atoms to the number of silicon atoms is 1:2–3.

6. The method as recited in claim 4, wherein said refractory metal silicide film has a thickness in the range of 10 to 50 nm.

7. The method as recited in claim 1, wherein said silicon film includes silicon atoms therein by at least 80% based on the total number of atoms contained in said silicon film.

8. The method as recited in claim 1, wherein said element is one of a resistive element and a thin film transistor.

9. The method as recited in claim 1 further comprising the step of ion-implanting the same impurities as those contained in said impurity region into said refractory metal silicide film.

10. A method of fabricating a semiconductor device, comprising the steps of:
   (a) forming an impurity region at a surface of a silicon substrate;
   (b) depositing an insulative film over said silicon substrate;
   (c) forming a contact hole through said insulative film to expose said impurity region of said silicon substrate;
   (d) forming an electrode wiring over said contact hole, said electrode wiring comprising a refractory metal silicide film and a silicon film overlying said refractory metal silicide film, said refractory metal silicide film overlying said exposed impurity region;
   (e) depositing a second insulative film over a resultant product of step (d);
   (f) depositing a polysilicon film on said second insulative film;
   (g) patterning said polysilicon film to form an element; and
   (h) heat-treating a resultant product of step (g) at high temperature in oxidizing atmosphere, step (h) being carried out at any time after step (f) has been completed.

11. The method as recited in claim 10, wherein step (h) is carried out later than step (f), but prior to step (g).

12. The method as recited in claim 10, wherein step (h) is carried out later than step (g).

13. The method as recited in claim 10 further comprising the step of (i) implanting requisite impurities into deposited polysilicon film, said step (h) being carried out later than or prior to said step (i).

14. The method as recited in claim 10, wherein step (h) is carried out at the range of 750 degrees to 950 degrees centigrade.

15. The method as recited in claim 10, wherein step (h) is carried out so that said polysilicon element is oxidized to a depth in the range of 2 nm to 40 nm measured from a surface thereof.

16. The method as recited in claim 10, wherein said silicon film includes silicon atoms therein by at least 80% based on the total number of atoms contained in said silicon film.

17. A method of fabricating a semiconductor device including a static random access memory having a resistive element, a first field effect transistor having a driver insulative gate, and a second field effect transistor having a transfer insulative gate, a source region of said first field effect transistor being in connection with a source voltage film working as a low level voltage line, an impurity region of said second field effect transistor, which region is to become a source or drain region, being in connection with a bit line or a reverse bit line, said method comprising the steps of:
   (a) forming an electrode voltage film on said source region of first field effect transistor and on said source region of second field effect transistor if the said impurity region of second field effect transistor is a source region, said electrode voltage film comprising a refractory metal silicide film and a silicon film overlying on said refractory metal silicide film, said refractory metal silicide film being deposited on said source regions;
   (b) forming an interlayer insulative layer over said silicon film;
   (c) depositing a polysilicon film over said interlayer insulative layer;
   (d) patterning said polysilicon film to form said resistive element; and
   (e) heat-treating a resultant product of step (d) at high temperature in an oxidizing atmosphere, step (e) being carried out at any time after step (c) has been completed.

18. The method as recited in claim 17, wherein step (e) is carried out at a temperature in the range of 750 degrees to 950 degrees centigrade.

19. The method as recited in claim 17, wherein step (e) is carried out so that said polysilicon element is oxidized to a depth in the range of 2 nm to 40 nm measured from a surface thereof.

20. The method as recited in claim 17, wherein said silicon film includes silicon atoms therein by at least 80% based on the total number of atoms contained in said silicon film.

* * * * *

UNITED STATES PATENT AND TRADEMARK OFFICE
CERTIFICATE OF CORRECTION

PATENT NO. : 5,770,495
DATED : June 23, 1998
INVENTOR(S) : Nolifumi SATO et al.

It is certified that error(s) appears in the above-identified patent and that said Letters Patent is hereby corrected as shown below:

Col. 4, line 19, change "suicide" to --silicide--.

Col. 10, line 18, change "82" to --32--.

Signed and Sealed this

Twelfth Day of January, 1999

Attest:

Attesting Officer

*Acting Commissioner of Patents and Trademarks*